United States Patent
Shih et al.

(10) Patent No.: US 10,147,611 B1
(45) Date of Patent: Dec. 4, 2018

(54) METHOD FOR PREPARING SEMICONDUCTOR STRUCTURES

(71) Applicant: NANYA TECHNOLOGY CORPORATION, New Taipei (TW)

(72) Inventors: Shing-Yih Shih, New Taipei (TW); Cheng-Wei Wang, Taoyuan (TW); Tzu-Li Tseng, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/688,384

(22) Filed: Aug. 28, 2017

(51) Int. Cl.
*H01L 21/311* (2006.01)
*H01L 21/308* (2006.01)
*H01L 21/033* (2006.01)

(52) U.S. Cl.
CPC ...... *H01L 21/3088* (2013.01); *H01L 21/0337* (2013.01); *H01L 21/0338* (2013.01); *H01L 21/3086* (2013.01)

(58) Field of Classification Search
CPC ............. H01L 21/0337; H01L 21/0338; H01L 21/3086; H01L 21/3088
USPC ......................... 438/694, 696, 700, 717, 736
See application file for complete search history.

(56) References Cited

U.S. PATENT DOCUMENTS

| 8,871,646 B2 | 10/2014 | DeVilliers | |
|---|---|---|---|
| 2006/0240361 A1* | 10/2006 | Lee | H01L 21/0337 430/313 |
| 2008/0014752 A1* | 1/2008 | Cha | H01L 21/0337 438/700 |
| 2008/0090419 A1* | 4/2008 | Koh | H01L 21/0337 438/696 |
| 2015/0024597 A1* | 1/2015 | Gao | H01L 21/3086 438/694 |
| 2016/0268142 A1* | 9/2016 | Liou | H01L 21/0337 |
| 2016/0307772 A1* | 10/2016 | Choi | H01L 21/31116 |
| 2018/0033622 A1* | 2/2018 | Swaminathan | H01L 21/0337 |
| 2018/0061650 A1* | 3/2018 | Mahorowala | H01L 21/0337 |

FOREIGN PATENT DOCUMENTS

| TW | 201500572 A | 1/2015 |
|---|---|---|
| TW | 201529883 A | 8/2015 |
| TW | 201705428 A | 2/2017 |

* cited by examiner

*Primary Examiner* — Binh X Tran
(74) *Attorney, Agent, or Firm* — Muncy, Geissler, Olds & Lowe, P.C.

(57) ABSTRACT

The present disclosure provides a method for preparing semiconductor structures. The method includes the following steps: A substrate is provided. A plurality of first core features spaced apart from each other is formed over the substrate. A spacer layer is formed over the first core features, and the spacer layer is formed to cover sidewalls and top surfaces of each first core feature. A plurality of second core features is formed over the substrate, and portions of the spacer layer are exposed through the second core features. A densification treatment is performed on the second core features, and the spacer layer is removed to form a plurality of openings between the first core features and the second core features.

19 Claims, 16 Drawing Sheets

METHOD FOR PREPARING SEMICONDUCTOR STRUCTURES

TECHNICAL FIELD

The present disclosure relates to a method for preparing semiconductor structures, and more particularly, to a patterning method for preparing the semiconductor structures.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is then transferred from the photomask(s) to a mask layer to form a mask pattern, and to a target layer from the mask pattern. However, with the advancing miniaturization and integration requirements of semiconductor devices, including memory devices such as dynamic random access memories (DRAMs), flash memory, static random access memories (SRAMs), and ferroelectric (FE) memories, the semiconductor structures or features for such devices become finer and more miniaturized as well. Accordingly, the continual reduction in semiconductor structure and feature sizes places ever-greater demands on the techniques used to form the structures and features.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing semiconductor structures. The method includes the following steps: A substrate is provided. A plurality of first core features spaced apart from each other is formed over the substrate. A spacer layer is formed over the first core features, and the spacer layer is formed to cover sidewalls and top surfaces of each first core feature. A plurality of second core features is formed over the substrate, and portions of the spacer layer are exposed through the second core features. A densification treatment is performed on the second core features, and the spacer layer is removed to form a plurality of openings between the first core features and the second core features.

In some embodiments, the step of forming the plurality of first core features further includes the following steps: A first sacrificial layer and a patterned photoresist are sequentially formed over the substrate. The first sacrificial layer is then etched through the patterned photoresist to form the plurality of first core features.

In some embodiments, the step of forming the plurality of second core features further includes the following steps: A second sacrificial layer is formed over the substrate, and a portion of the second sacrificial layer is removed to expose the portions of the spacer layer covering top surfaces and sidewalls of the first core features.

In some embodiments, the method for preparing the semiconductor structures further includes forming a mask layer over the top surfaces of the first core features.

In some embodiments, the step of forming the plurality of second core features further includes the following steps: A second sacrificial layer is formed over the substrate, and a portion of the second sacrificial layer and portions of the spacer layer are removed to expose the mask layer over the top surfaces of the first core features and to expose the spacer layer covering the sidewalls of the first core features.

In some embodiments, the step of forming the plurality of second core features further includes the following steps: A second sacrificial layer is formed over the substrate, and a portion of the second sacrificial layer and portions of the spacer layer are removed to expose the top surfaces of the first core features and the spacer layer covering the sidewalls of the first core patterns.

In some embodiments, the first core features and the second core features include a same material.

In some embodiments, the densification treatment is performed to densify the second core features and the first core features simultaneously.

In some embodiments, the densification treatment includes UV curing or thermal treatment.

In some embodiments, the first core features and the second core features are spaced apart from each other by the openings.

In some embodiments, the substrate further includes a hard mask formed thereon.

In some embodiments, the hard mask includes a multi-layered structure.

In some embodiments, the multi-layered structure includes at least one first mask layer and one second mask layer stacked on the first mask layer.

In some embodiments, the method for preparing the semiconductor structures further includes etching the hard mask through the openings to form a plurality of recesses in the hard mask.

In some embodiments, the method for preparing the semiconductor structures further includes etching the substrate to form a plurality of semiconductor structures through the recesses.

In some embodiments, the semiconductor structures are spaced apart from each other by spaces.

In some embodiments, a width of the spaces is substantially the same as a thickness of the spacer layer.

In the present disclosure, the densification treatment is performed on the second core features and thus an etching rate of the second core features is differentiated from an etching rate of the spacer layer. As such, profiles of the second core features are not impacted during removal of the spacer layer to form the openings. Accordingly, the openings formed between the first core features and the second core features is deep enough with clear profiles. More importantly, when transferring the openings to the substrate, fine semiconductor structures can be obtained because the openings include sufficient depth.

In contrast, with a comparative method applied without performing the densification treatment on the second core features, the openings between the first core features and the second core features are not deep enough because the second core features are etched and consumed during removal of the spacer layer. Consequently, the semiconductor structures formed by transferring the openings to the substrate suffer from insufficient etching issue and the reliability and performance of the semiconductor device are adversely impacted.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
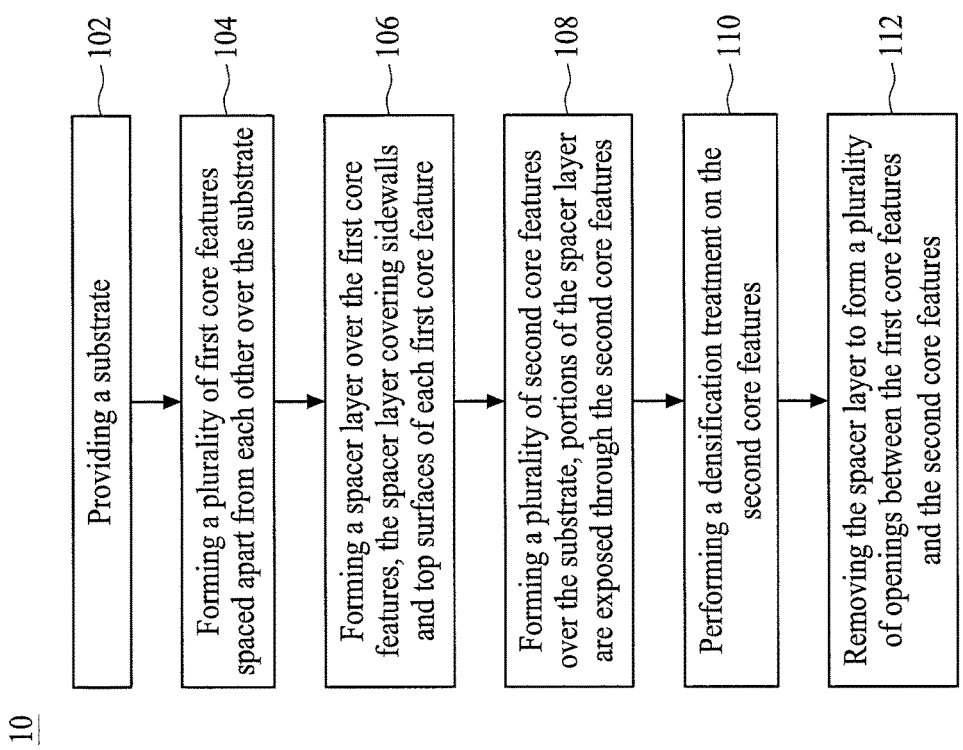
FIG. 1 is a flow diagram illustrating a method for preparing semiconductor structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be turned a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, via, pillars, trenches, troughs, or moats. As used herein, the term "core" refers a mask feature formed at a vertical level. As used herein, "target layer" refers to a layer in which a pattern of semiconductor structures is to be formed. A target layer may be part of the substrate. A target layer may be a metal layer, a semiconductor layer, or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing semiconductor structures, in accordance with some embodiments of the present disclosure. The method for preparing semiconductor structures 10 includes a step 102, providing a substrate. The method for preparing the semiconductor structures 10 further includes a step 104, forming a plurality of first core features spaced apart from each other over the substrate. The method for preparing the semiconductor structures 10 further includes a step 106, forming a spacer layer over the first core features, the spacer layer covering sidewalls and top surfaces of each first core feature. The method for preparing the semiconductor structures 10 further includes a step 108, forming a plurality of second core features over the substrate. More importantly, portions of the spacer layer are exposed through the second core features. The method for preparing the semiconductor structures 10 further includes a step 110, performing a densification treatment on the second core features. The method for preparing the semiconductor structures 10 further includes a step 112, removing the spacer layer to form a plurality of openings between the first core features and the second core features after the densification treatment. The method for preparing the semiconductor structures 10 will be further described according to one or more embodiments.

Figure 2:
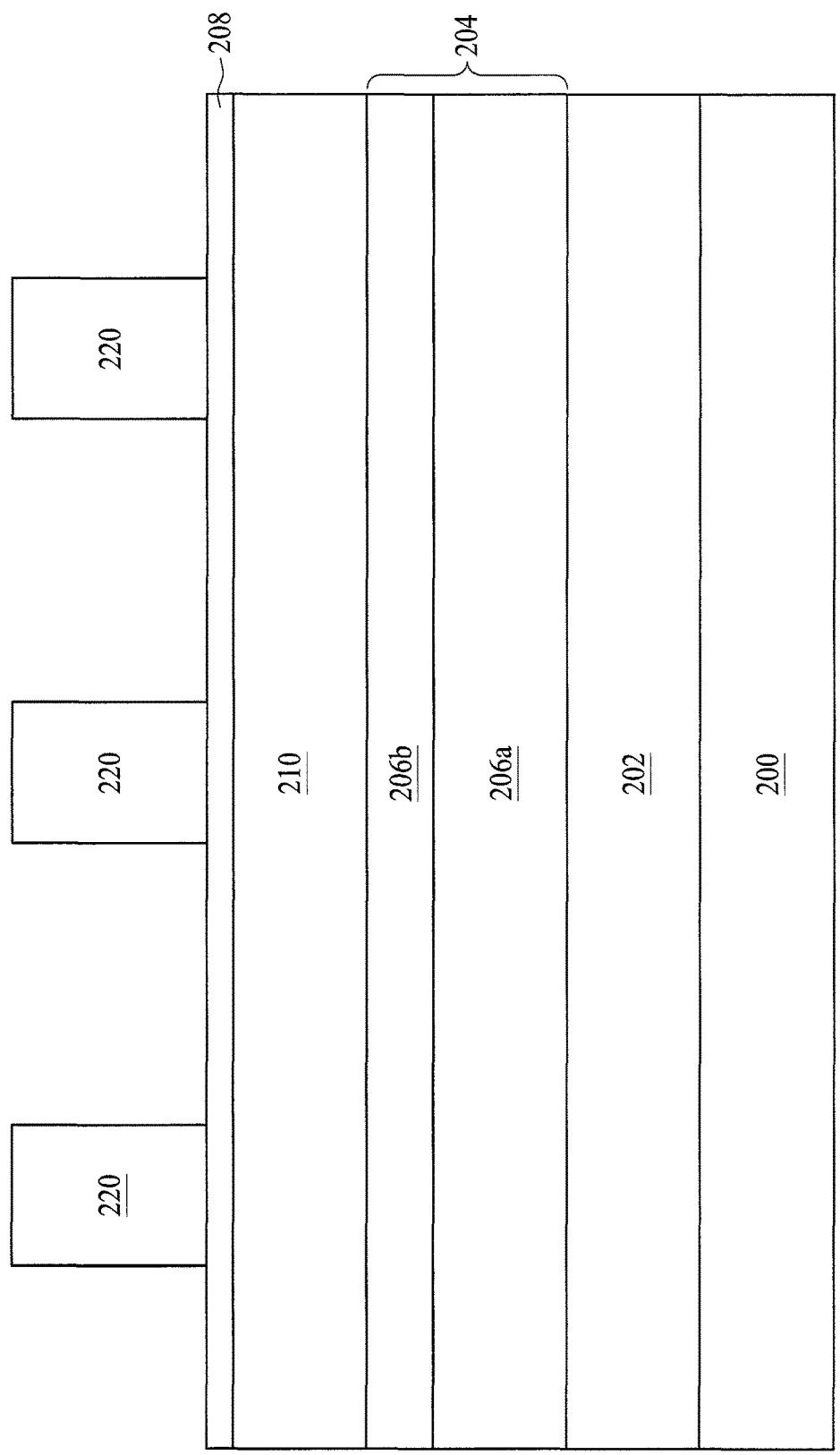
FIGS. 2 to 10 are schematic diagrams illustrating various fabrication stages of the method for preparing the semiconductor structures in accordance with some embodiments of the present disclosure.

FIGS. 2 to 10 are schematic diagrams illustrating various fabrication stages constructed according to the method for preparing the semiconductor structures in accordance with some embodiments of the present disclosure. Referring to FIG. 2, a substrate 200 is provided according to step 102. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof. In some embodiments of the present disclosure, a target layer 202 is formed over the substrate 200. The target layer 202 can include a multiple layers or a single layer. The target layer 202 may be a layer in which various IC components, parts, or structures are to be formed through IC fabrication processes. Examples of the components, parts, or structures include transistors, capacitors, resistors, diodes, conductive lines, electrodes, spacers, trenches, etc. The target layer 202 can include materials that are selected based on the types of devices to be formed. Examples of the target layer materials include, for example but not limited to, dielectric materials, semiconductive materials, and conductive materials.

Still referring to FIG. 2, a hard mask 204 is provided over the target layer 202 and the substrate 200. In some embodiments of the present disclosure, the hard mask 204 includes a multi-layered structure. For example, the hard mask 204 can include at least one first mask layer 206a and one second mask layer 206b stacked on the first mask layer 206a. More importantly, the first mask layer 206a and the second mask layer 206b can include different materials or materials sufficiently different in compositions that the second mask layer 206b can be selectively removable using an appropriate etch chemistry relative to the first mask layer 206a. By way of example and not limitation, the first mask layer 206a can include a silicon oxide (SiO) material, a silicon nitride (SiN) material, or a silicon oxynitride (SiON) material. The second mask layer 206b can include SiO material, SiN material, or SiON material. The second mask layer 206b is selected such that the second mask layer 206b is selectively removed without affecting the first mask layer 206a when using an appropriate chemistry. One of ordinary skill in the art would easily understand that the present disclosure may select a single hard mask or a bi-layered hard mask based on cost, time, performance, and processing considerations for a given application.

Still referring to FIG. 2, a first sacrificial layer 210 is formed over the hard mask 204. In some embodiments of the present disclosure, the first sacrificial layer 210 can include organic materials, and the organic materials can include photosensitive material(s) or non-photosensitive material(s), but the disclosure is not limited thereto. Additionally, a mask layer 208 can be selectively formed over the first sacrificial layer 210 as shown in FIG. 2. However, in some embodiments of the present disclosure, the mask layer 208 can be omitted. The mask layer 208 may provide improved etch selectivity and/or antireflective properties for removing the first sacrificial layer 210, and may provide a substantially planar surface on which additional materials are to be formed, as explained below.

A patterned photoresist 220 is formed over the mask layer 208 or the first sacrificial layer 210, as shown in FIG. 2. The patterned photoresist 220 can include lines formed by performing, for example but not limited to, conventional photolithography, as is known in the art of semiconductor manufacturing. It should be understood that although three lines of the patterned photoresist 220 are illustrated in FIG. 2 for simplicity of explanation, any number of lines may be formed, as will be apparent to one of ordinary skill in the art upon consideration of the present disclosure.

Figure 3:
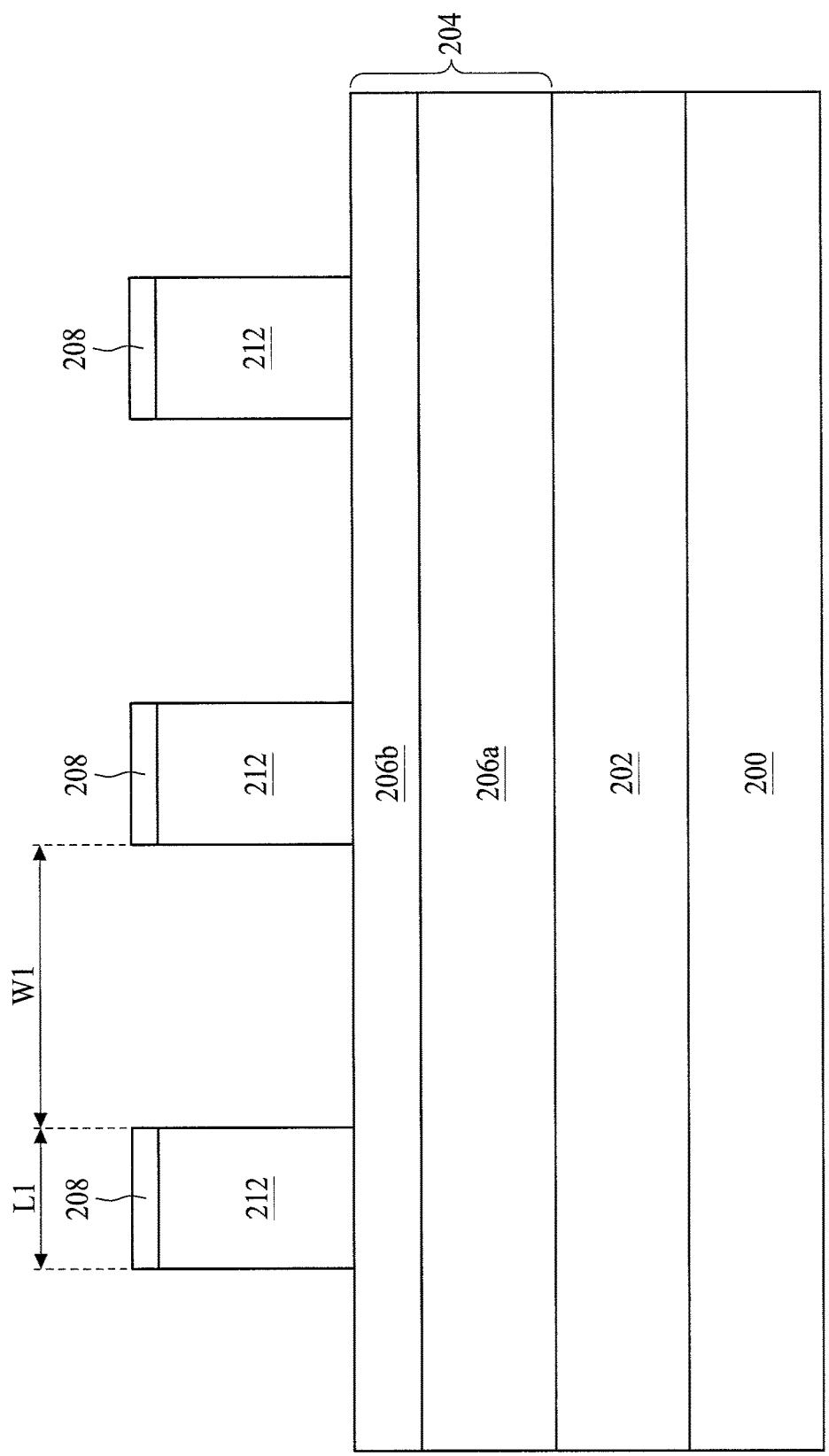

Referring to FIG. 3, the first sacrificial layer 210 is etched through the patterned photoresist 220 to form a plurality of first core features 212 over the substrate 200 according to step 104. As shown in FIG. 3, the first core features 212 are spaced apart from each other. It should be easily realized by those skilled in the art that the first core features 212 include the lines as defined by the patterned photoresist 220. Thereafter, the patterned photoresist 220 is removed. The first core features 212 include a line width L1, and spaces between the first core features 212 include a width W1.

Figure 4:
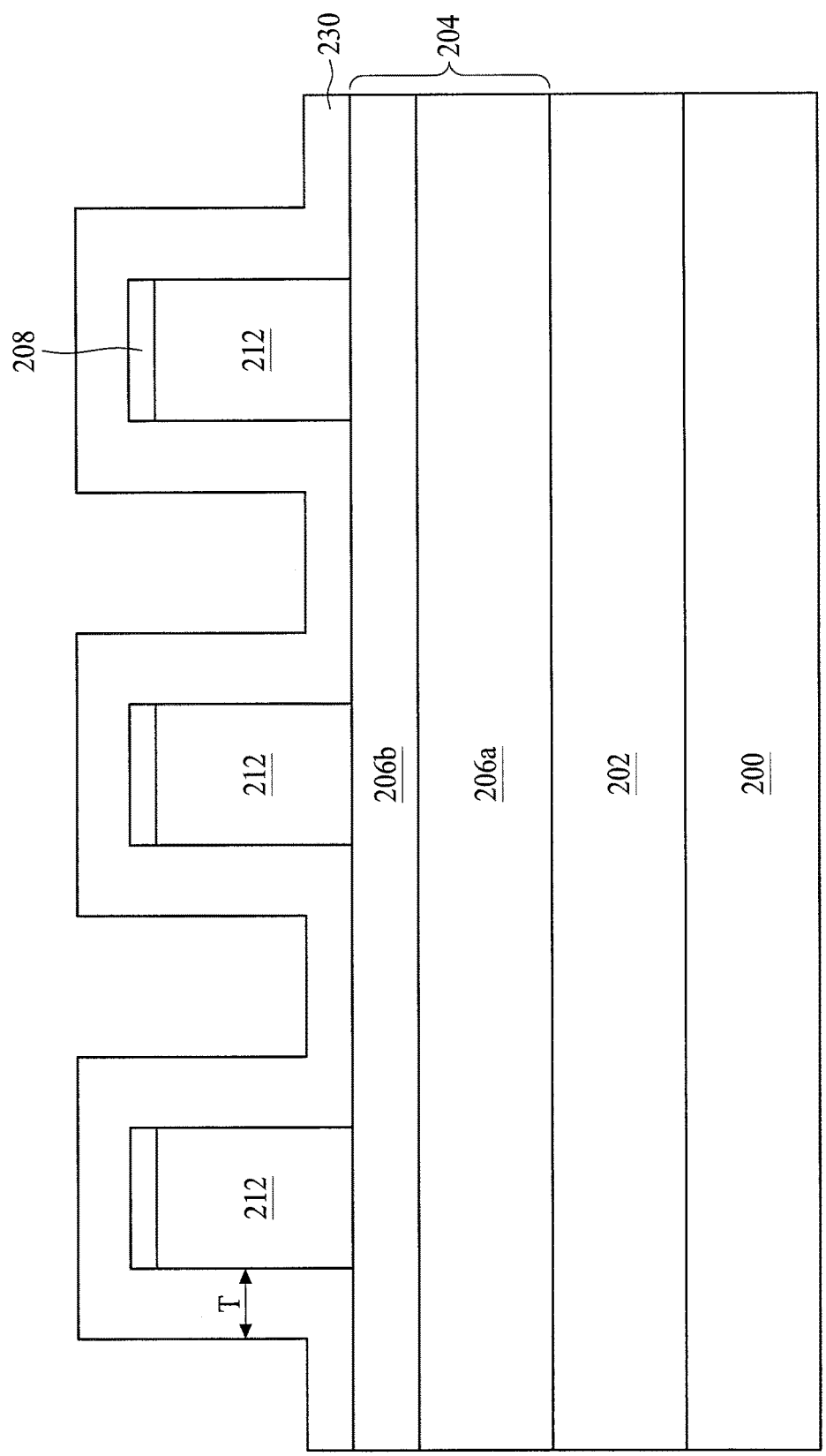

Referring to FIG. 4, a spacer layer 230 is formed over the first core features 220 according to step 106. The spacer layer 230 is conformally formed to cover or coat sidewalls and top surfaces of each first core feature 212 as shown in FIG. 4. In some embodiments of the present disclosure, the spacer layer 230 includes a thickness T. In some embodiments of the present disclosure, the thickness T of the spacer layer 230 is less than 20 nanometers (nm). In some embodiments of the present disclosure, the thickness T of the spacer layer 230 is less than 12 nm, but the disclosure is not limited thereto. The spacer layer 230 can include materials different from those of the first sacrificial layer 210, but the disclosure is not limited thereto. In some embodiments of the present disclosure, the spacer layer 230 can include, for example but not limited to, silicon nitride (SiN), silicon oxide (SiO), silicon oxynitride (SiON), a combination thereof, a stack layer thereof, or the like.

Figure 5:
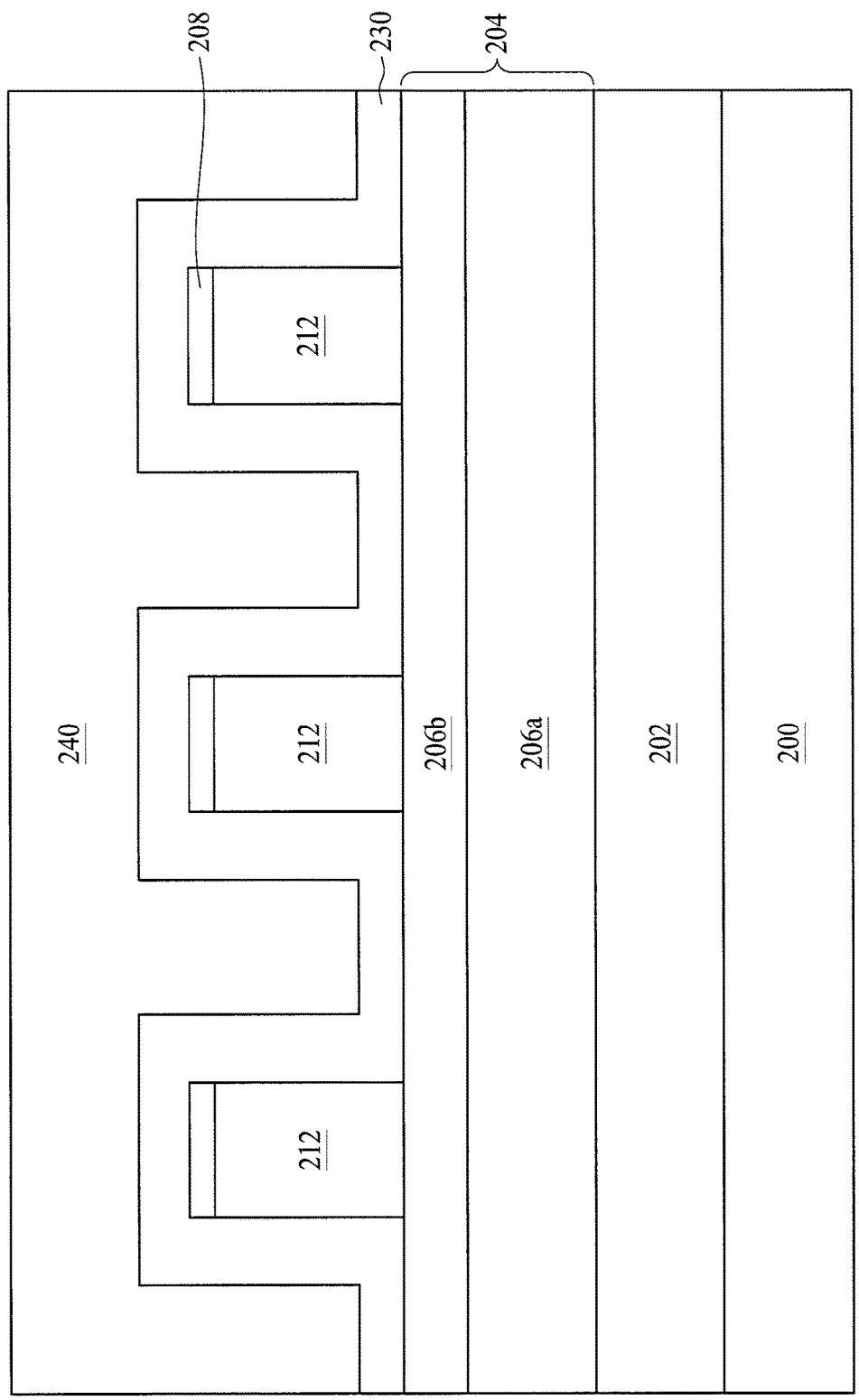

Referring to FIG. 5, a second sacrificial layer 240 is formed over the substrate 200. The second sacrificial layer 240 is formed to fill the spaces between the first core features 212 and the spacer layer 230. In some embodiments of the present disclosure, the second sacrificial layer 240 can include organic materials, and the organic materials can include photosensitive materials or non-photosensitive materials, but the disclosure is not limited thereto. In some embodiments of the present disclosure, the second sacrificial layer 240 includes materials different from those of the first sacrificial layer 210. In some embodiments of the present disclosure, the first sacrificial layer 210 and the second sacrificial layer 240 include the same material.

Figure 6:
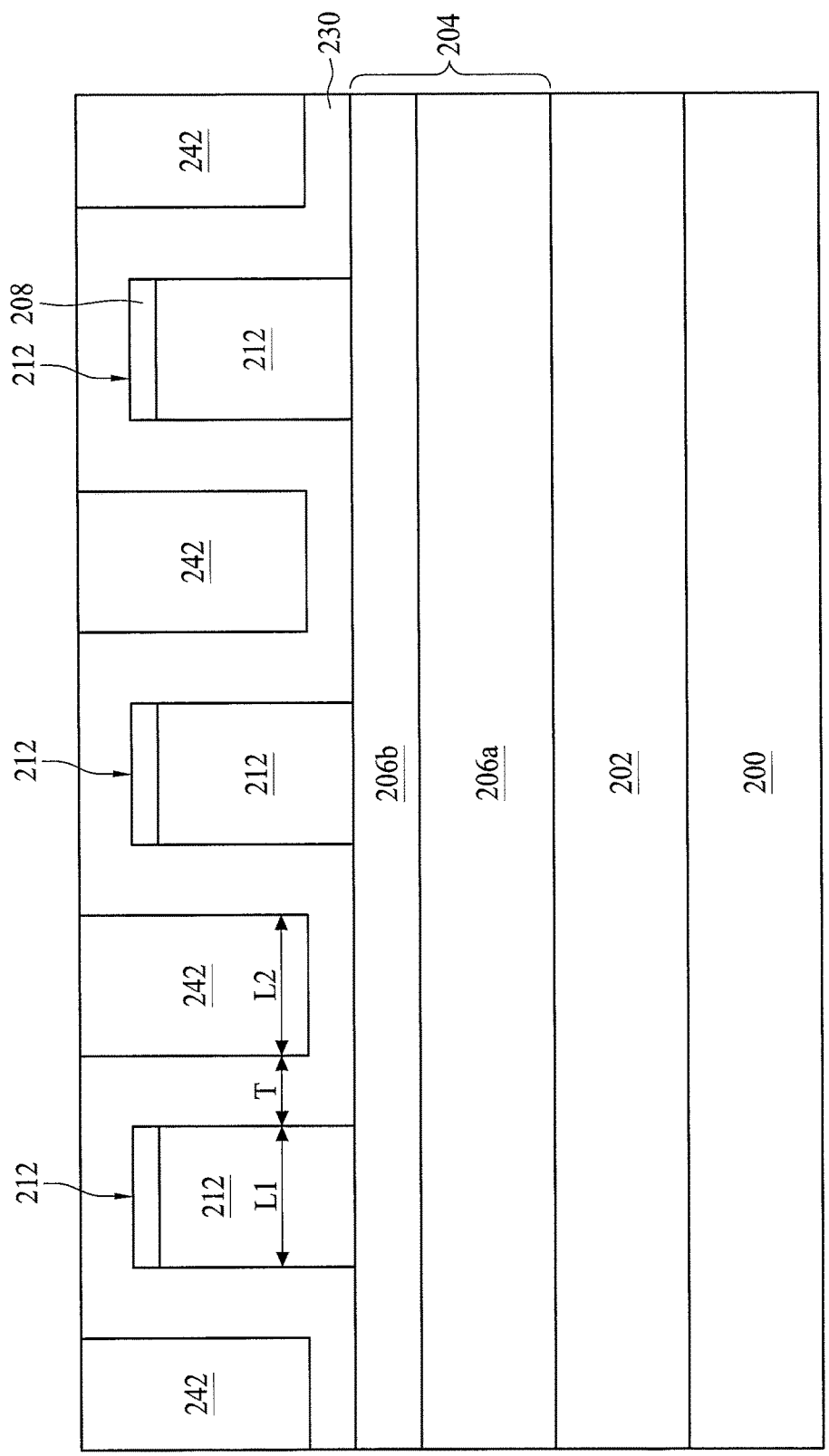

Referring to FIG. 6, a portion of the second sacrificial layer 240 is removed to form a plurality of second core features 242 and to expose portions of the spacer layer 230 according to step 108. In some embodiments of the present disclosure, the portion of the second sacrificial layer 240 can be removed by an etching back process, but the disclosure is not limited thereto. Accordingly, the second sacrificial layer 240 is etched back to expose the spacer layer 230 over the top surfaces and the sidewalls of the first core features 212, as shown in FIG. 6. Accordingly, the remaining second sacrificial layer 240 can include the plurality of second core features 242, and the second core features include a line width L2. More importantly, the line width L2 of the second core features 242 is substantially the same as the line width L1 of the first core features 212. As also shown in FIG. 6, the first core features 212 are covered by the spacer layer 230 while the second core features 242 cover the spacer layer 230. In addition, the first core features 212 and the second core features 242 are spaced apart from each other by the spacer layer 230, which includes the thickness T.

Figure 7:
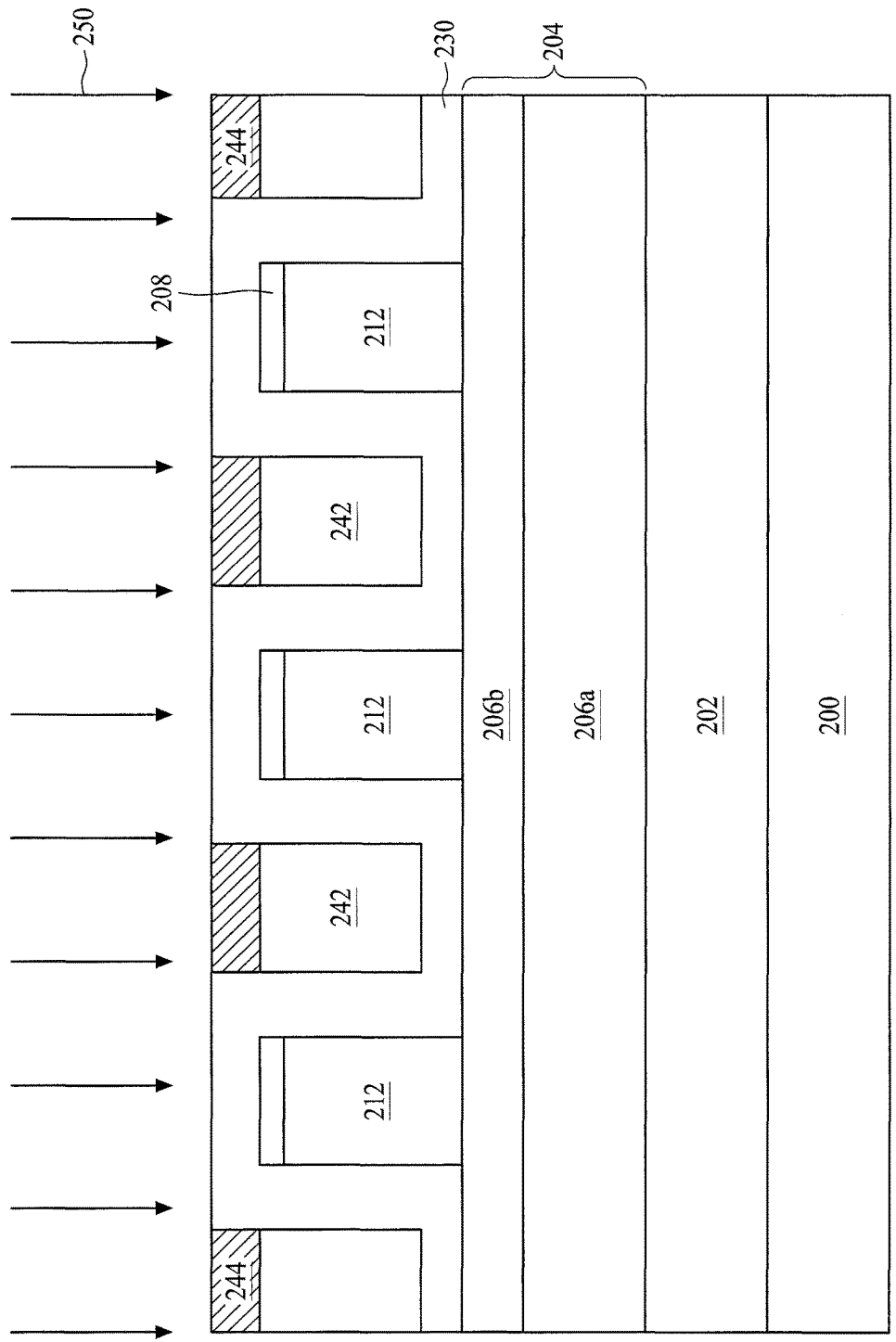

Referring to FIG. 7, a densification treatment 250 is subsequently performed on the second core features 242 according to step 110. In some embodiments of the present disclosure, the densification treatment 250 includes a surface treatment such as a UV treatment or a chemical treatment. In some embodiments of the present disclosure, the densification treatment 250 includes a thermal treatment, and the thermal treatment includes a temperature between about 100° C. and about 300° C. Accordingly, the densification treatment 250 modifies and densifies at least a portion of each second core feature 242, such as a surface or an upper portion. As shown in FIG. 7, at least an upper portion 244 of each second core feature 242 is therefore densified. Consequently, an etching rate of the upper portions 244 of the second core features 242 is sufficiently different from an etching rate of the spacer layer 230. Additionally, since the first core features 212 are covered by the spacer layer 230 as shown in FIG. 7, an etching rate of the first core features 212 is substantially impervious to the densification treatment 250.

Figure 8:
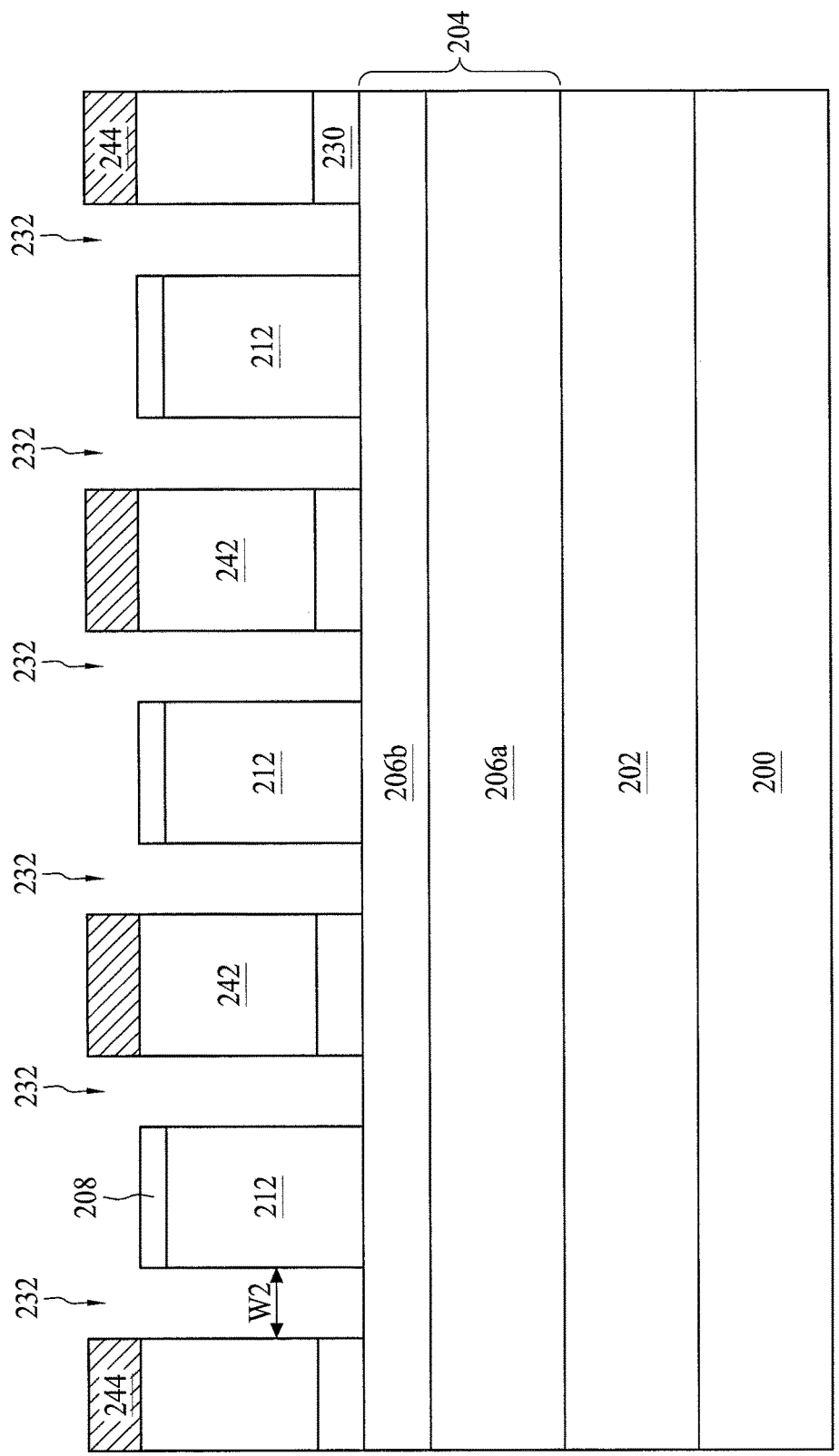

Referring to FIG. 8, the spacer layer 230 is removed to form a plurality of openings 232 between the first core features 212 and the second core features 242 after the densification treatment 250 according to step 112. In some embodiments of the present disclosure, the hard mask 204 is exposed at bottoms of the openings 232 as shown in FIG. 8. As mentioned above, since the etching rate of the upper portions 244 of the second core features 242 is sufficiently different from the etching rate of the spacer layer 230, portions of the spacer layer 230 over the top surfaces and sidewalls of the first core features 212 can be removed without damaging or consuming the second core features 242. Accordingly, the first core features 212 and the second core features 242 are spaced apart from each other by the openings 232, and the openings 232 include a width W2 that is the same as the thickness T of the spacer layer 230. Additionally, a height of the first core features 212 is less than a height of the second core features 242 in accordance with the present embodiment.

Figure 9:
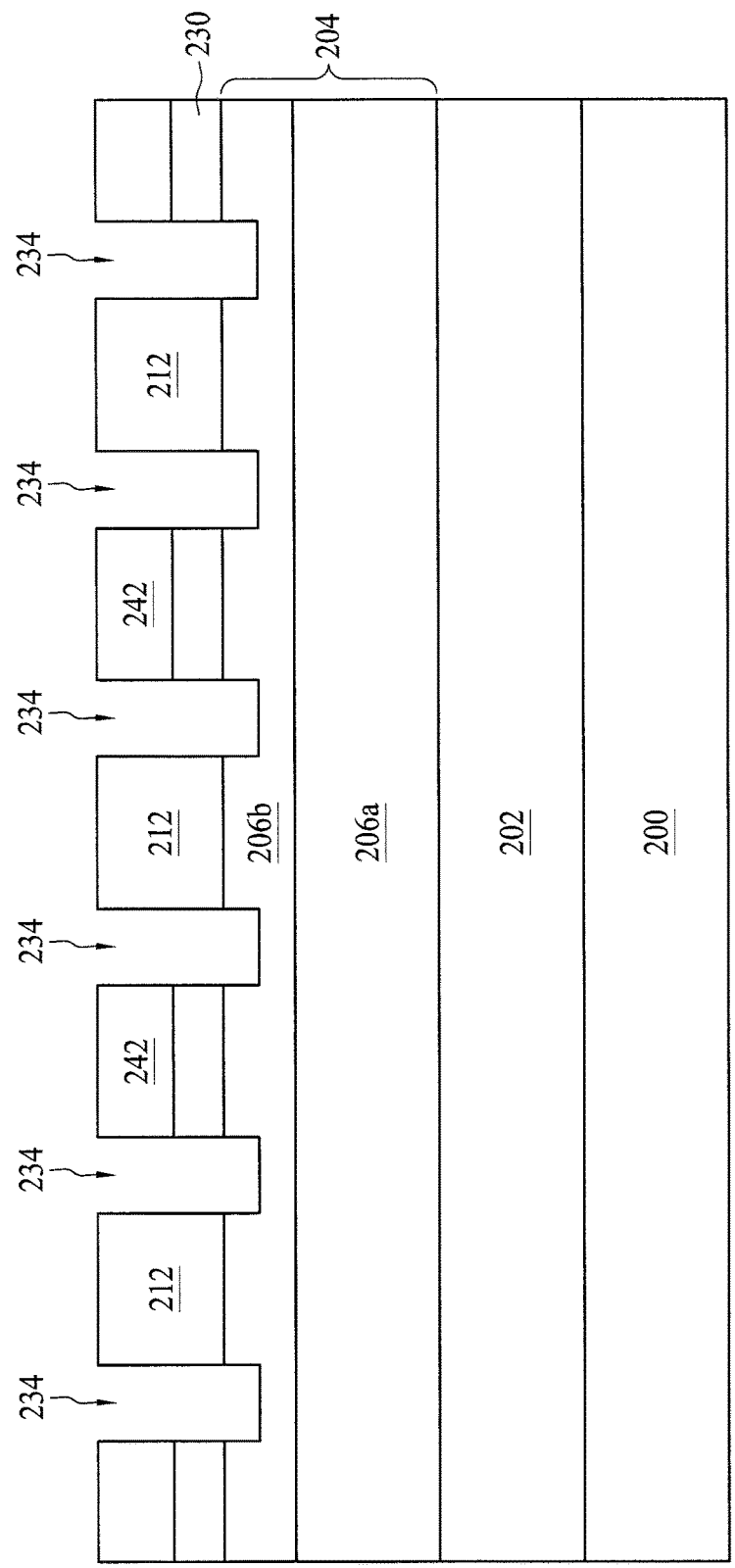

Referring to FIG. 9, next, the hard mask 204 exposed at the bottoms of the openings 232 is etched to form a plurality of recesses 234. As shown in FIG. 9, the recesses 234 are formed between the first core features 212 and the second core features 242. In some embodiment of the present disclosure, the recesses 234 can be formed at least in the second hard mask layer 206b, but the disclosure is not limited thereto.

Figure 10:
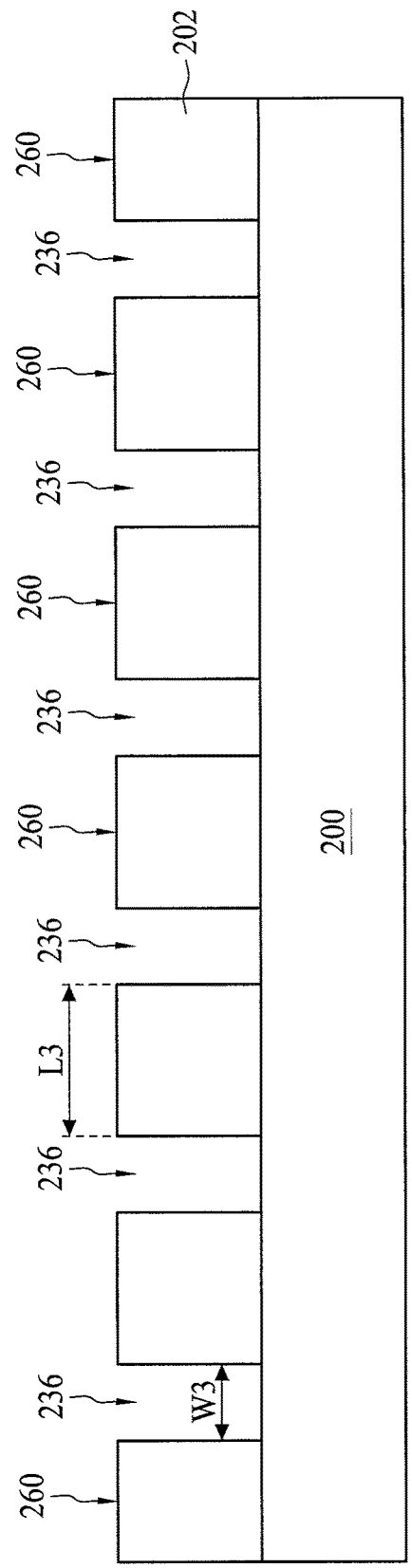

Referring to FIG. 10, the substrate 200 or the target layer 202 is etched to form a plurality of semiconductor structures 260 through the recesses 234. It is noteworthy that the semiconductor structures 260 include a line width L3, and the line width L3 is substantially the same as the line width L1 of the first core features 212 and the line width L2 of the second core features 242. As shown in FIG. 10, the semiconductor structures 260 are spaced apart from each other by spaces 236, and a width W3 of the spaces 236 is substantially the same as the thickness T of the spacer layer 230.

According to the embodiments mentioned above, the densification treatment 250 is performed on the second core features 242 and thus the etching rate of at least the upper portions 244 of the second core features 242 is sufficiently different from the etching rate of the spacer layer 230. As such, profiles of the second core features 242 are not impacted during removal of the spacer layer 230 to form the openings 232. Accordingly, the openings 232 formed between the first core features 210 and the second core features 242 are deep enough with clear profiles. More importantly, by transferring the openings 232 to the hard mask 204 and then to the substrate 200 or the target layer 202, the fine semiconductor structures 260 can be obtained.

Figure 11:
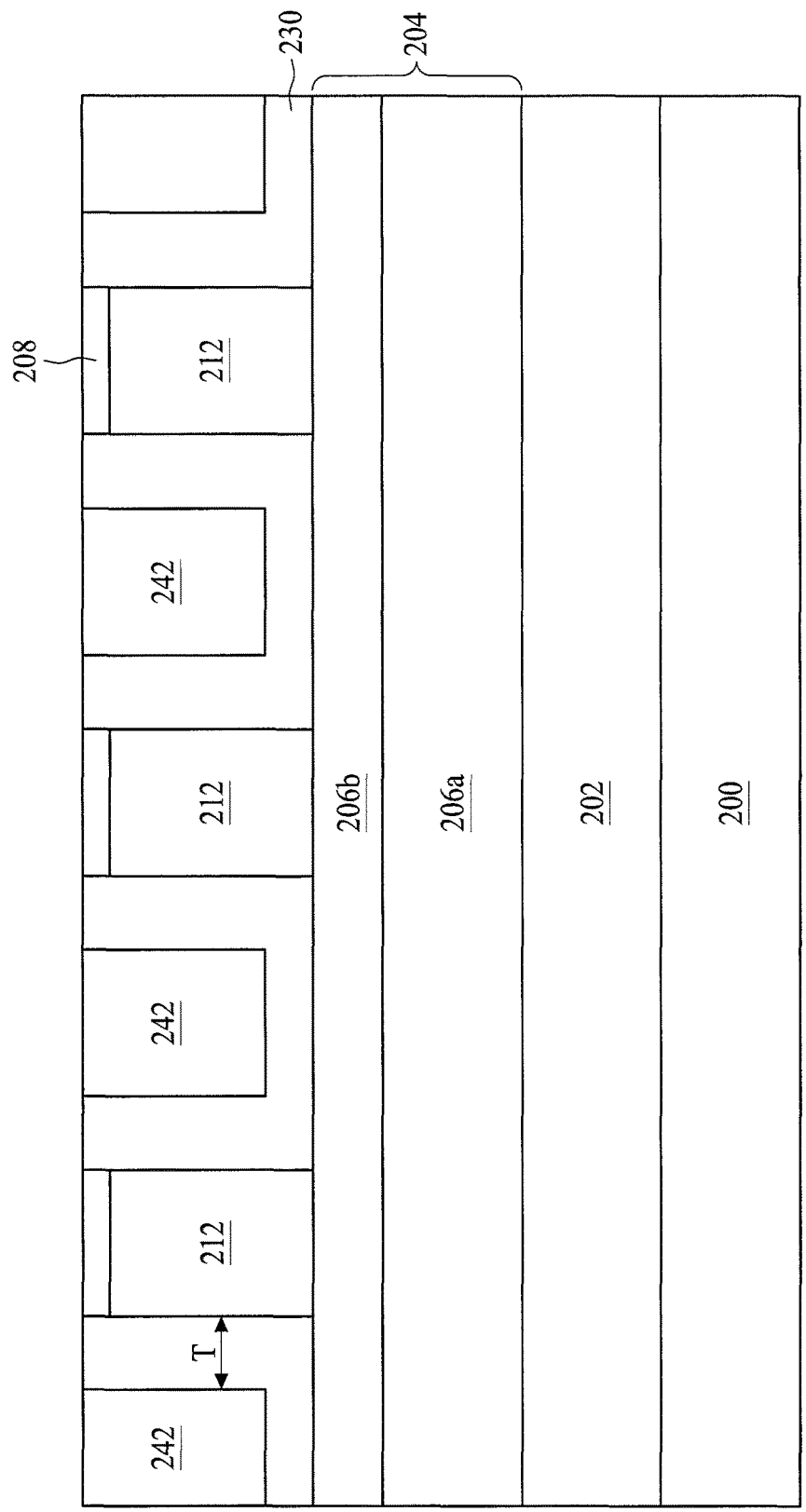
FIGS. 11 to 13 are schematic diagrams illustrating the method for preparing the semiconductor structures in accordance with other embodiments of the present disclosure.
Figure 12:
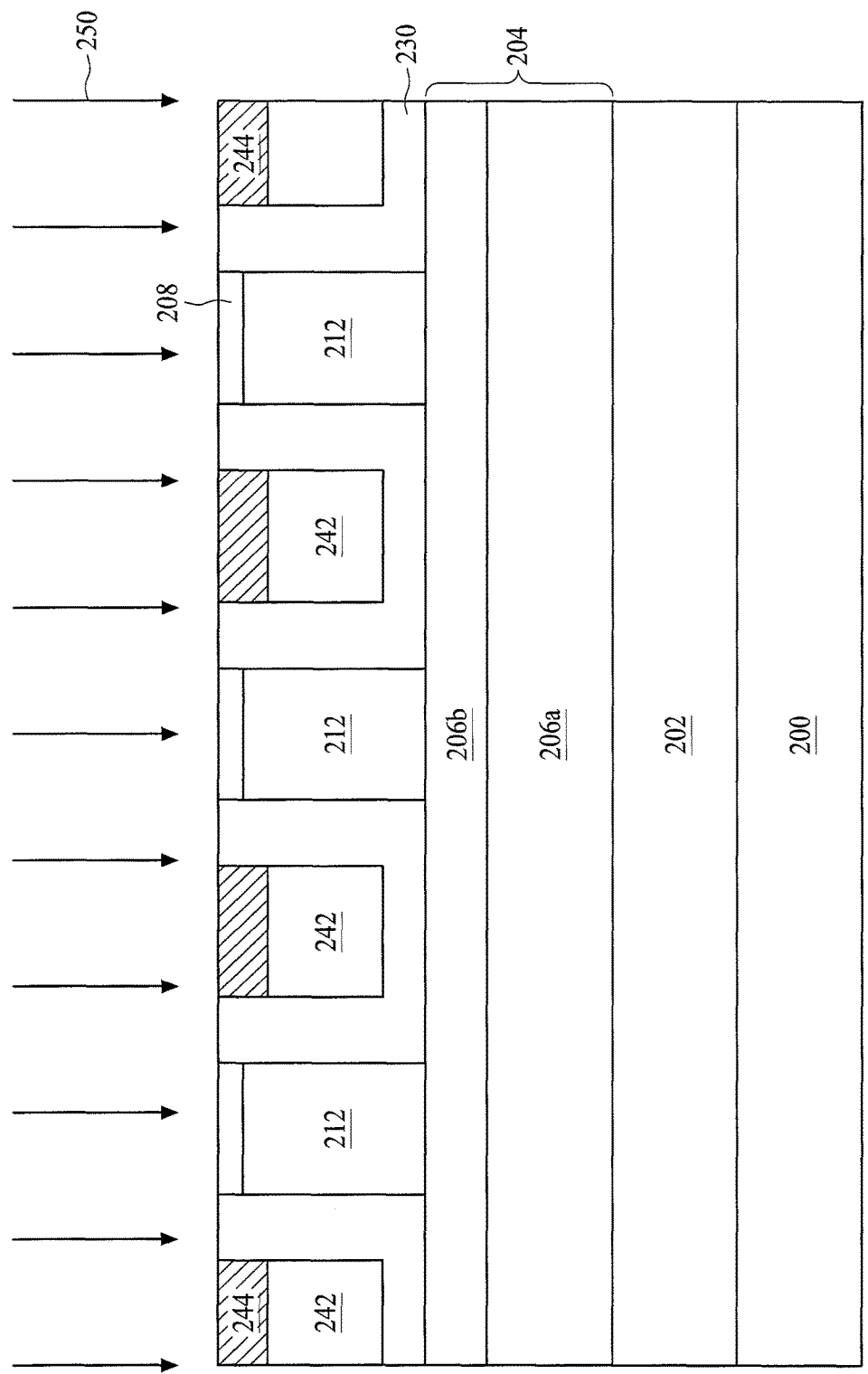
Figure 13:
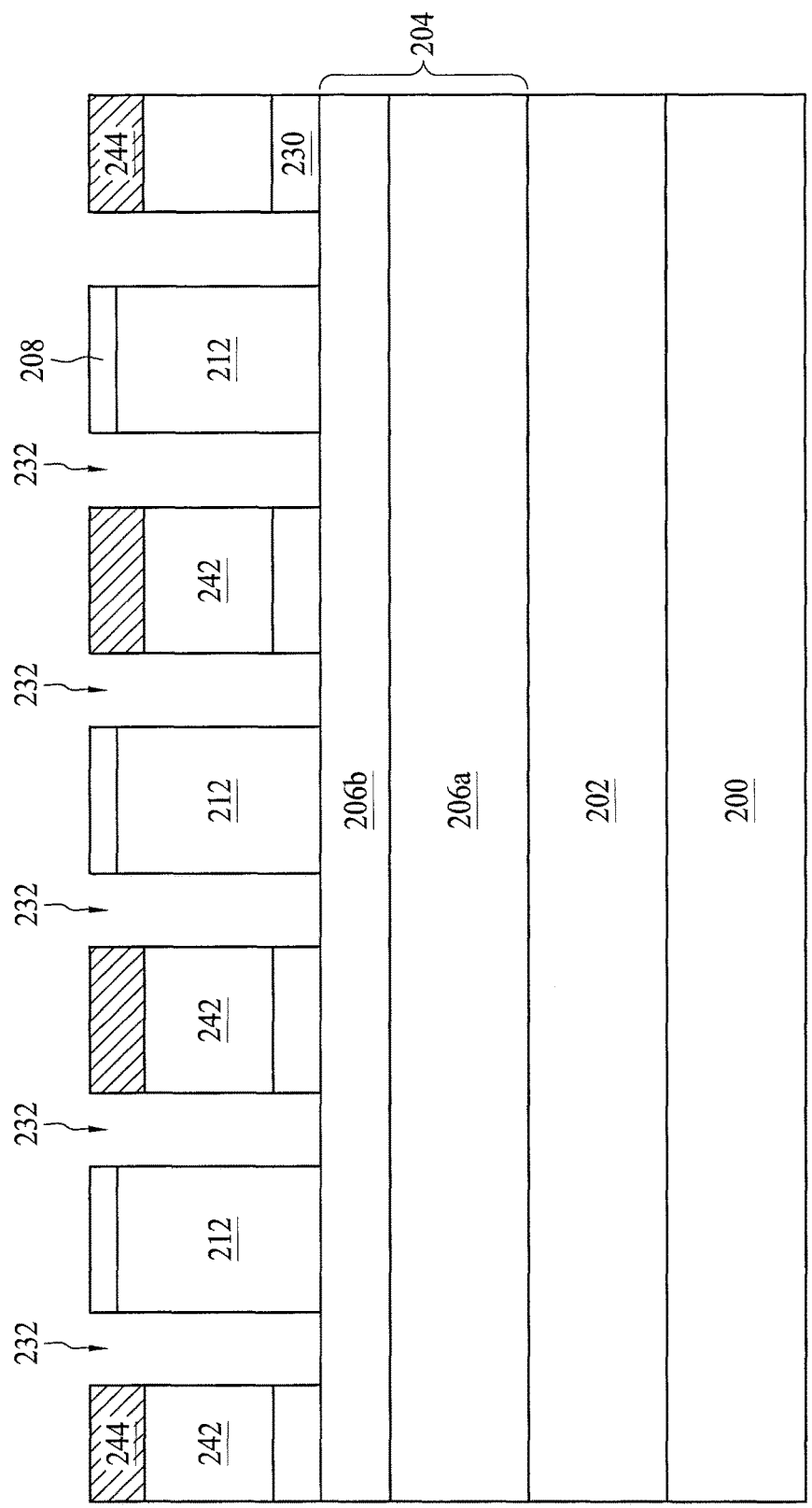

Please refer to FIGS. 11-13, which are schematic diagrams illustrating various fabrication stages of the method for preparing the semiconductor structures in accordance with other embodiments of the present disclosure. It should be understood that similar features in FIGS. 2 to 10 and 11 to 13 are identified by the same reference numerals for clarity and simplicity. Furthermore, similar elements in FIGS. 2 to 10 and 11 to 13 can include similar materials, and thus such details are omitted in the interest of brevity. As shown in FIG. 11, in some embodiments of the present disclosure, steps 102 to 106 are performed, and a spacer layer 230 is formed over the substrate 200 as shown in FIG. 11. As mentioned above, the spacer layer 230 covers sidewalls and top surfaces of a plurality of first core features 212. Since the components obtained by performing steps 102 to 106 are similar to those described above, such details are omitted in the interest of brevity, and thus only the differences are provided. Next, a second sacrificial layer 240 is formed over the substrate 200. Subsequently, a portion of the second sacrificial layer 240 is removed to form a plurality of second core features 242 and to expose portions of the spacer layer 230 according to step 108. As mentioned above, the portion of the second sacrificial layer 240 can be removed by an etching back process, but the disclosure is not limited thereto. In some embodiments of the present disclosure, the second sacrificial layer 240 is etched back to expose the spacer layer 230 over the top surfaces and the sidewalls of the first core features 212. More importantly, the second sacrificial layer 240 and the spacer layer 230 over the top surfaces of the first core features 212 are further removed to expose the mask layer 208 over the top surfaces of the first core features 212 as shown in FIG. 11. Accordingly, the remaining second sacrificial layer 240 can include the plurality of second core features 242 according to step 108. As also shown in FIG. 11, the first core features 212 and the second core features 242 are spaced apart from each other by the spacer layer 230, which includes the thickness T.

Referring to FIG. 12, a densification treatment 250 is subsequently performed on the second core features 242 according to step 110. As mentioned above, in some embodiments, the densification treatment 250 can include a surface treatment such as a UV treatment or a chemical treatment. In some embodiments, the densification treatment 250 can include a thermal treatment. As shown in FIG. 12, at least an upper portion 244 of each second core feature 242 is densified, and thus an etching rate of the upper portions 244 of the second core features 242 is sufficiently different from an etching rate of the spacer layer 230. In some embodiments, since the first core features 212 are covered by the mask layer 208 as shown in FIG. 12, an etching rate of the first core features 212 is substantially impervious to the densification treatment 250.

As shown in FIG. 13, step 112 can be performed to remove the spacer layer 230 and to form a plurality of openings 232 between the first core features 212 and the second core features 242 as mentioned above. As shown in FIG. 13, the hard mask 204 can be exposed at bottoms of the openings 232. Furthermore, the spacer layer 230 is sandwiched between the substrate 200 and the second core feature 242. As mentioned above, the openings 232 can be transferred to the hard mask 204 and then to the substrate 200 or the target layer 202. Additionally, a height of the first core features 212 is substantially the same as a height of the second core features 242 in accordance with the present embodiment.

As mentioned above, the densification treatment 250 is performed on the second core features 242 and thus the etching rate of at least the upper portions 244 of the second core features 242 is sufficiently different from the etching rate of the spacer layer 230. As such, profiles of the second core features 242 are not impacted during removal of the spacer layer 230 to form the openings 232. As mentioned above, the openings 232 formed between the first core features 210 and the second core features 242 is deep enough with clear profiles. More importantly, by transferring the openings 232 to the hard mask 305 and then to the substrate 200 or the target layer 202, the fine semiconductor structures can be obtained.

Figure 14:
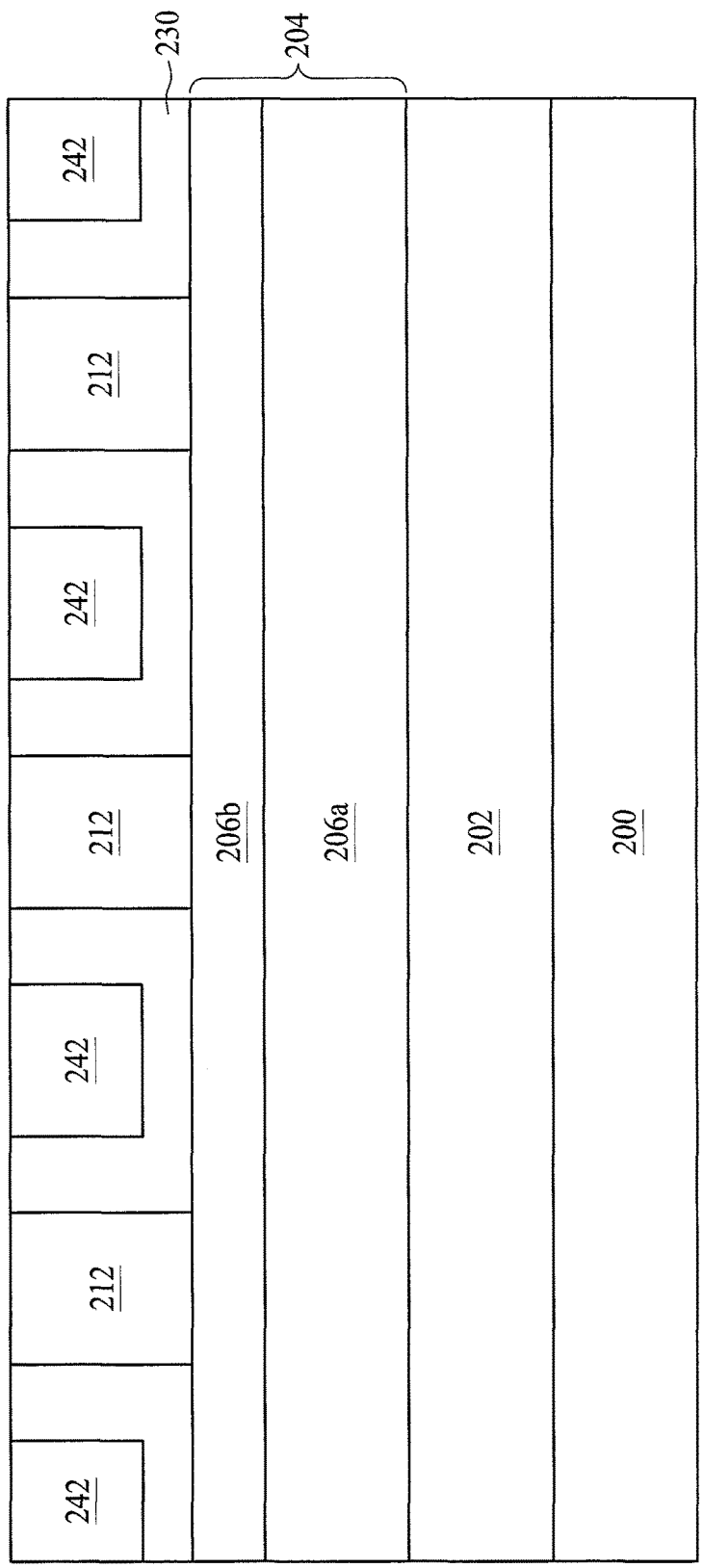
FIGS. 14 to 16 are schematic diagrams illustrating the method for preparing the semiconductor structures in accordance with still other embodiments of the present disclosure.
Figure 15:
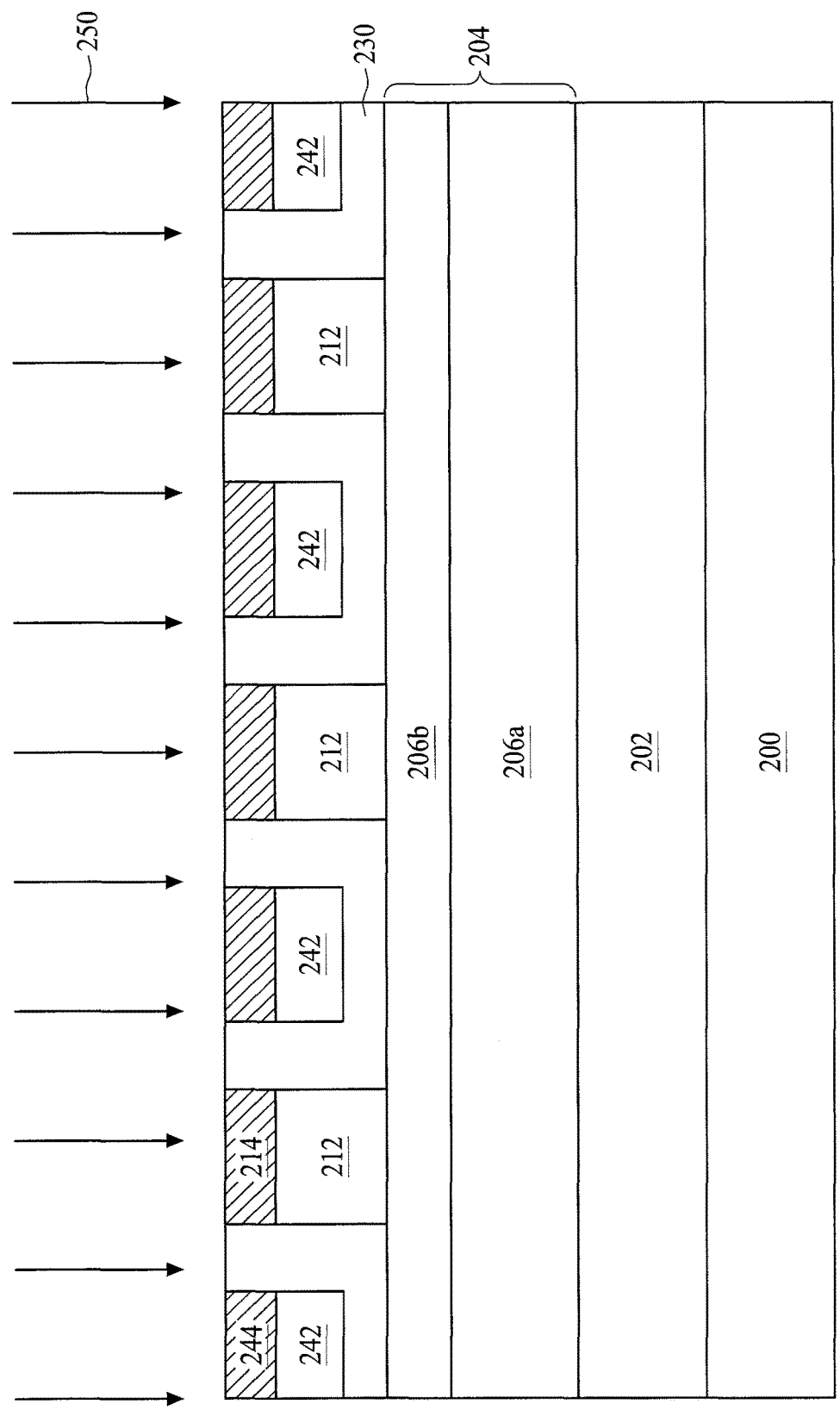
Figure 16:
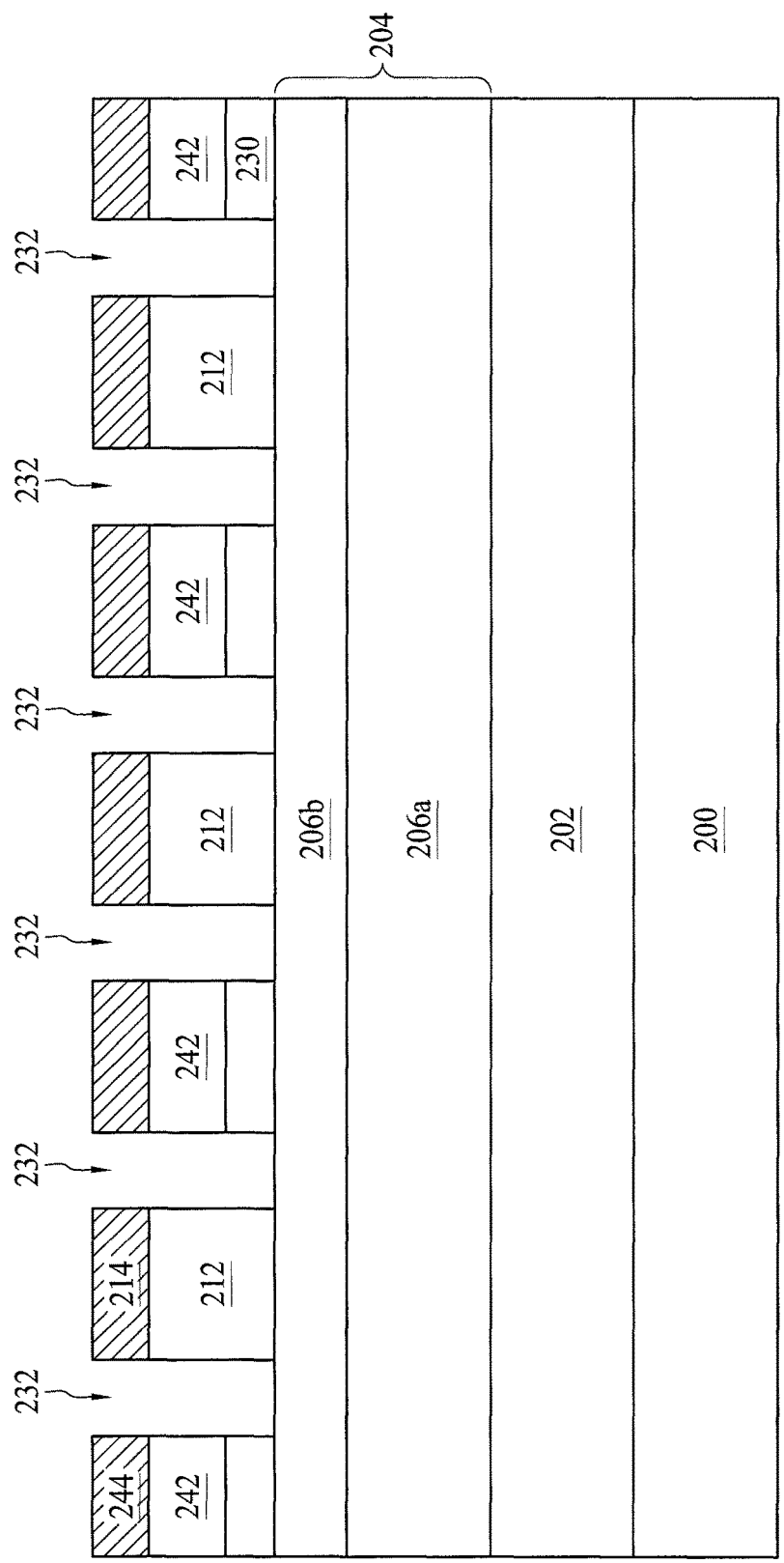

FIGS. 14 to 16 are schematic diagrams illustrating various fabrication stages according to the method for preparing the semiconductor structures in accordance with some embodiments of the present disclosure. It should be understood that similar features in FIGS. 2 to 10 and 14 to 16 are identified by the same reference numerals for clarity and simplicity. Furthermore, similar elements in FIGS. 2 to 10 and 14 to 16 can include similar materials, and thus such details are omitted in the interest of brevity. As shown in FIG. 14, in some embodiments of the present disclosure, steps 102 to 106 are performed, and a spacer layer 230 is formed over the substrate 200. As mentioned above, the spacer layer 230 covers sidewalls and top surfaces of a plurality of first core features 212. Since the components obtained by performing steps 102 to 106 are similar to those described above, some details are omitted in the interest of brevity, and only the differences are detailed. Next, a second sacrificial layer 240 is formed over the substrate 200. Subsequently, in step 108, a portion of the second sacrificial layer 240 is removed to form a plurality of second core features 242 and expose portions of the spacer layer 230. As mentioned above, the portion of the second sacrificial layer 240 can be removed by an etching back process, but the disclosure is not limited thereto. In some embodiments of the present disclosure, the second sacrificial layer 240 is etched back to expose the spacer layer 230 over the top surfaces and the sidewalls of the core features 212. More importantly, layers such as the spacer layer 230 and the mask layer 208 over the top surfaces of the first core features 212 are further removed to expose the top surfaces of the first core features 212 as shown in FIG. 14. Accordingly, in step 108, the remaining second sacrificial layer 240 can include the plurality of second core features 242. As also shown in FIG. 14, the first core features 212 and the second core features 242 are spaced apart from each other by the spacer layer 230, which includes the thickness T.

Referring to FIG. 15, in step 110, a densification treatment 250 is subsequently performed on both of the first core features 212 and the second core features 242. As mentioned above, the densification treatment 250 can include a surface treatment such as a UV treatment or a chemical treatment in some embodiments of the present disclosure. The densification treatment 250 can include a thermal treatment. In accordance with the present embodiments, since the top surfaces of the first core features 212 are exposed, at least an upper portion 214 of each first core feature 212 and at least an upper portion 244 of each second core feature 242 are densified. In some embodiments, the first core features 212 and the second core features 242 can include the same material, and an etching rate of the upper portions 214 of the first core features 212 and an etching rate of the upper portions 244 of the second core features 242 are different from an etching rate of the spacer layer 230 by the densification treatment 250. However, it should be understood that the first core features 212 and the second core features 242 can include different materials, but the etching rates of the upper portions 214, 244 of the first and second core features 212, 242 can be still modified to be different from the etching rate of the spacer layer 230 by the densification treatment 250.

As shown in FIG. 16, in step 112, a plurality of openings 232 is formed between the first core features 212 and the second core features 242. The hard mask 204 can be exposed at bottoms of the openings 232. Furthermore, the spacer layer 230 is sandwiched between the substrate 200 and the second core feature 242. In addition, the openings 232 can be transferred to the hard mask 204 and then to the substrate 200 or the target layer 202. Additionally, a height of the first core features 212 is substantially the same as a height of the second core features 242 in accordance with the present embodiment.

In the present disclosure, the densification treatment 250 is performed on the second sacrificial layer 240, and thus the etching rate of at least the upper portion 244 of the second core feature 242 is sufficiently different from the etching rate of the spacer layer 230. As such, profiles of the second core features 242 are not impacted during removal of the spacer layer 230 to form the openings 232. Accordingly, the openings 232 formed between the first core features 212 and the second core features 242 are deep enough with clear profiles. More importantly, by transferring the openings 232 to the hard mask 204 and then to the substrate 200 or the target layer 202, the fine semiconductor structures 260 can be obtained.

In contrast, in a comparative method without performing the densification treatment to the second core features, the openings between the first core features and the second sacrificial layer are not deep enough because the second sacrificial layer is etched and consumed during removal of the spacer layer. Consequently, the semiconductor structures formed by transferring the openings to the substrate suffer from insufficient etching issue and the reliability and performance of the semiconductor device is adversely impacted.

One aspect of the present disclosure provides a method for preparing semiconductor structures. The method includes the following steps: A substrate is provided. A plurality of first core features spaced apart from each other is formed over the substrate. A spacer layer is formed over the first core features, wherein the spacer layer is formed to cover sidewalls and top surfaces of each first core feature. A plurality of second core features is formed over the substrate, and portions of the spacer layer are exposed through the second core features. A densification treatment is performed on the second core features and the spacer layer is removed to form a plurality of openings between the first core features and the second core features.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing semiconductor structures, comprising:
providing a substrate;
forming a plurality of first core features spaced apart from each other over the substrate;
forming a spacer layer over the first core features, the spacer layer covering sidewalls and top surfaces of each first core feature;
forming a plurality of second core features over the substrate, wherein portions of the spacer layer are exposed through the second core features;
performing a densification treatment on the second core features; and removing the spacer layer to form a plurality of openings between the first core feature and the second core features after the densification treatment.

2. The method of claim 1, wherein forming the plurality of first core features further comprises:
sequentially forming a first sacrificial layer and a patterned photoresist over the substrate; and
etching the first sacrificial layer through the patterned photoresist to form the plurality of first core features.

3. The method of claim 1, wherein forming the plurality of second core features further comprises:
forming a second sacrificial layer over the substrate; and
removing a portion of the second sacrificial layer to expose the portions of the spacer layer covering top surfaces and sidewalls of the first core features.

4. The method of claim 1, wherein the spacer layer is sandwiched between the second core feature and the substrate.

5. The method of claim 1, wherein the first core features and the second core features are spaced apart from each other by the openings.

6. The method of claim 1, further comprising forming a mask layer over the top surfaces of the first core features.

7. The method of claim 6, wherein forming the plurality of second core features further comprises:
forming a second sacrificial layer over the substrate; and
removing a portion of the second sacrificial layer and portions of the spacer layer to expose the mask layer over the top surfaces of the first core features and to expose the spacer layer covering the sidewalls of the first core features.

8. The method of claim 1, wherein the densification treatment comprises UV curing or thermal treatment.

9. The method of claim 8, wherein the thermal treatment comprises a temperature between about 100° C. and about 300° C.

10. The method of claim 1, wherein forming the plurality of second core features further comprises:
forming a second sacrificial layer over the substrate; and
removing a portion of the second sacrificial layer and portions of the spacer layer to expose the top surfaces of the first core features and the spacer layer covering the sidewalls of the first core patterns.

11. The method of claim 10, wherein the first core features and the second core features comprise a same material.

12. The method of claim 11, wherein the densification treatment is performed to densify the second core features and the first core features simultaneously.

13. The method of claim 1, wherein the substrate further comprises a hard mask formed thereon.

14. The method of claim 13, wherein the hard mask comprises a multi-layered structure.

15. The method of claim 14, wherein the multi-layered structure comprises at least one first mask layer and one second mask layer stacked on the first mask layer.

16. The method of claim 13, further comprising etching the hard mask through the openings to form a plurality of recesses in the hard mask.

17. The method of claim 16, further comprising etching the substrate to form a plurality of semiconductor structures through the recesses.

18. The method of claim 17, wherein the semiconductor structures are spaced apart from each other by spaces.

19. The method of claim 18, wherein the spaces are substantially the same as a thickness of the spacer layer.

* * * * *